United States Patent Office 3,703,402
Patented Nov. 21, 1972

3,703,402

ELECTRON SENSITIVE COMPOSITIONS

Herbert S. Cole, Jr., Scotia, N.Y., assignor to General Electric Company

No Drawing. Filed Nov. 23, 1970, Ser. No. 92,307
Int. Cl. C01j *1/10;* B44d *1/50*
U.S. Cl. 117—37 R 10 Claims

ABSTRACT OF THE DISCLOSURE

Certain unsaturated partial esters of maleic anhydride copolymers with certain mono-vinylidene compounds are insensitive to actinic light but extremely sensitive to electrons. Thin coatings of these compositions are insolubilized with a radiation dose no greater than $5\times10^{-7}$ coul./cm.$^2$, which is a marked improvement over the materials now used as the electron-sensitive resist for making high resolution photomasks, microcircuits, etc.

ELECTRON SENSITIVE COMPOSITIONS

This invention relates to improved compositions for use in producing a desired pattern on a substrate by insolubilizing a surface coating of a polymerizable composition on selected areas of the substrate by irradiation of said areas with electrons to a radiation dose sufficient to convert such coatings on said areas to a state where it is insoluble in a solvent in which it was soluble prior to irradition and thereafter dissolving the coating from the unirradiated areas with said solvent. More particularly, this invention relates to an improved composition which is much more sensitive to electron irradiation than the compositions previously used for such surface coatings. My improved compositions are mono-unsaturated alcohol esters of maleic anhydride copolymers with mono-vinylidene compounds wherein said copolymers are free of halogens and aromatic groups.

Photosensitive compositions, i.e., those sensitive to actinic light, have long been used for making resists whereby the unexposed area has been dissolved away if it is a negative photoresist or the exposed area is washed away if it is a positive photoresist. These materials thereby permit artwork to be reproduced on a substrate which is subsequently painted, etched or otherwise marked so that removal of the mask from the substrate reveals the desired artwork. This artwork can be a true work of fine art, a decorative design, a printing plate, a printed circuit board, a micro-circuit on a silicon wafer, etc.

As more sophisticated electronic equipment has come in to use, the need for increasing the resolution (e.g., separation between lines and ability to produce very fine lines) has increased to a point where actinic light can no longer be used for many applications because of its long wavelength. To meet these needs, electron beams have been substituted for actinic light beams. In some applications, actinic light can still be used, providing an exposure mask is used which has much higher fidelity than is required in the photoreproduction made with the mask.

In order to make such a mask, a thin, transparent substrate is made opaque by metallizing one side with a metal such as chromium. After a resist is deposited on the metal layer, the desired pattern is produced by exposure to electrons, e.g., through a mask, by controlled deflection etc., and then washing away the still soluble portions followed by etching away the exposed chromium, thereby leaving the desired opaque design of metal on the transparent substrate, which can thereafter be used as the photomask.

Other metals than chromium can be used providing they can be deposited as thin films having the requisite opaqueness to light. In exposing the resist layer to electrons, various techniques can be used for controlling the electron beams since they can be magnetically deflected and therefore the exact sweep of the electron beam to produce a given design is easily controlled by well-known electronic circuits which can be computor controlled if desired. Using well-known techniques, the beam current, dwell time and accelerating voltage can be controlled so that the resist is exposed to the radiation dose required to insolubilize the resist.

The problem met in some of these more sophisticated applications are well documented, for example, in chapter 12, entitled "Electron Beams in Microelectronics" written by Oliver C. Wells, in the book "Introduction to Electron Beam Technology," edited by Robert Bakish, John Wiley & Sons, Inc., New York (1962); "High Resolution Electron Beam Exposure of Photoreisists" by R. K. Matta, Electrochem. Tech., 5, 382 (1967); "Two Interconnection Techniques for Large Scale Circuit Integration" by A. E. Brennemann et al., IBM J. Res. Develop., 11, 520 (1967); "High-Resolution Positive Resists for Electron-Beam Exposure" by I. Haller et al., IBM J. Res. Develop., 12, 251 (1968); "I. C.'s in Japan—A Closeup" by Yasuo Tarui, Electronics, 41 [10] 98 (1968); "I. C. Pattern Exposure by Scanning Electron Beam Apparatus" by S. Miyauchi et al., Solid State Technol., 12 [7] 43 (1969). In addition to the above references which discuss means of making exposure, U.S. Pat. 3,491,236—Newberry covers a specific method for electron beam fabrication of microelectronic circuit patterns and an article, "Advances in Fly's Eye Electron Optics," which he coauthored with others in "Proc. Nat. Electron. Conf.'s" 23, 746 (1967), discusses background optics useful for making electron beam exposures. All of these references and the references cited therein are hereby incorporated by reference as teachings of the various techniques used for preparing the substrate, applying the various coatings exposing the coating to electrons, developing the exposed coating, etching the design in the substrates and thereafter utilizing the design in the making of various devices.

At the time the need arose for the use of electron beams instead of actinic light for making the exposure, it was extremely fortunate that the same resists which could be used with actinic light were also capable of being used with electron beams. However, since these coatings had been specifically designed to be used with actinic light, they left much to be desired in the way of being optimized for use with electrons. For example, almost all of the coatings require an exposure to a radiation dose of at least $10^{-5}$ coulombs per square centimeter (hereinafter abbreviated to coul./cm.$^2$), to be sufficiently insolubilized that the unexposed areas can be dissolved without disturbing the exposed areas. Since a beam of electrons can be controlled, e.g., its energy, sweep time, sweep path, etc., exposure to a radiation dose much smaller than this could be used beneficially if a material of higher electron sensitivity could be obtained. Furthermore, since the electron-sensitive materials do not require that they be light-sensitive, the light-sensitivity of these materials is a definite disadvantage because the preparation of the coating composition itself, its application to the substrate, and its handling prior to exposure must all be carried out either in the dark or under lights having wavelengths high enough in the near infrared region that the coating is not adversely affected prior to use. In view of these two drawbacks, it would be highly desirable to have a faster, more electron-sensitive composition which was not sensitive to visible light.

Various approaches have been made in the past to meet these desired improvements. Certain materials are known to decompose under electron irradiation. Haller et al. in the above referenced article discusses four of these materials with specific emphasis on poly(methylmethacrylate). Since actinic light does not cause such decomposition, these materials do provide materials which are only sensitive to electrons. However, since the decomposition upon exposure is not what one could consider a very fast reaction, extremely thin coatings must be used and even then the irradiation dose must be in the order of $5\times10^{-5}$ to $5\times10^{-4}$ coul./cm.$^2$ at the optimum beam current.

French Pat. 1,555,957 uses various maleic anhydride copolymers either alone or in conjunction with polymerizable monomers for making compositions useful as etch-resists which are insolubilized in those areas exposed to electrons. The copolymers alone, require radiation doses in the order of $10^{-5}$ coul./cm.$^2$ or greater. Incorporation of a polymerizable monomer in the copolymer before irradiation has a variable effect on the radiation dose required which is dependent on the monomer. Most monomers decrease the required radiation dose to the order of $10^{-6}$ coul./cm.$^2$ with methylene bisacrylamide being the most effective; requiring a radiation dose of $3\times10^{-7}$ coul./cm.$^2$. Still further improvement would be highly desirable. In addition the necessity of mixing two materials is not desirable and the tendency for the monomers to polymerize on standing or on exposure to light or heat, and the volatility of many of the monomers, creates problems in storing and use of the materials.

I have discovered that the copolymers of maleic anhydride with at least one monomer copolymerizable therewith, selected from the group consisting of $C_{2-3}$-alkenes, vinyl $C_{1-20}$-alkyl ether, $C_{1-8}$-alkyl esters of acrylic acid and $C_{1-8}$-alkyl esters of $\alpha$-($C_{1-8}$-alkyl)acrylic acids, although not very electron-sensitive per se, do become extremely electron-sensitive if they are esterified with an ethylenically unsaturated alcohol selected from the group consisting of allyl alcohol, $\alpha$-($C_{1-8}$-alkyl)allyl alcohols, propargyl alcohol, monoacrylate esters of the alkylene gycols and the $\alpha$-($C_{1-8}$-alkyl) acrylate esters of the alkylene glycols.

Typical examples of the $C_{1-8}$-alkyl groups that can be present in the above compounds are: methyl, ethyl, propyl, isopropyl, the various butyl isomers, i.e., n-butyl, isobutyl, sec-butyl, tert-butyl, etc., the various amyl isomers, the various hexyl isomers, including cyclohexyl, the various heptyl isomers, the various octyl isomers, etc. Examples of the various $C_{1-20}$-alkyl groups present in the vinyl ethers are, in addition to the above $C_{1-8}$-alkyl groups, the various nonyl isomers, the various decyl isomers, the various undecyl, dodecyl, tetradecyl, hexadecyl, octadecyl, etc., isomers, the various eicosyl isomers, etc. Examples of the various alkylene groups that can be present in the glycols are, ethylene, 1,2- and 1,3-propylene, the various butylene, pentylene, hexylene, heptylene, octylene isomers, etc.

From the above description it is apparent that the $C_{2-3}$-alkenes are ethylene and propylene, the acrylate and $\alpha$-acrylate esters have the formula $$CH_2{=}\underset{\displaystyle R_b}{\underset{|}{C}}{-}COOR_a$$

allyl alcohol and the $\alpha$-alkylallyl alcohols have the formula $$CH_2{=}\underset{\displaystyle R_b}{\underset{|}{C}}{-}CH_2OH$$

the acrylate and $\alpha$-alkylacrylate mono-esters of the alkylene glycols have the formula $$CH_2{=}\underset{\displaystyle R_b}{\underset{|}{C}}{-}COO{-}R_c{-}OH$$

and the alkyl vinyl ethers have the formula $$CH_2{=}CH{-}O{-}R_d$$

where $R_a$ is $C_{1-8}$-alkyl, $R_b$ is hydrogen or $C_{1-8}$-alkyl, $R_c$ is $C_{2-8}$-alkylene and $R_d$ is $C_{1-20}$-alkyl.

When maleic anhydride is copolymerized with another monomer the resulting copolymer is often a copolymer where the repeating units are anhydride units, which alternate along the polymer chain with the units of the other polymerizable monomer. Generally this occurs when the maleic anhydride is present in equal or greater molar amount than the other monomer in the polymerizable mixture, but there are some copolymers where it is so regardless of the ratio of the two monomers in the polymerizable mixture. There is no known copolymer wherein the anhydride units are greater than 50 mole percent of the repeating units, but there are copolymers where the other polymerizable monomer is present in greater than 50 mole percent. This is a well-documented phenomenon and the factors governing the type and composition of the copolymer obtained has been well studied. See for example, the discussions of monomer reactivities as applied to copolymerizations under the entries of "Acids, Maleic and Fumaric" in vol. 1 (1964), and "Copolymerization" in vol. 4 (1966) of "Encyclopedia of Polymer Science and Technology," Interscience Publishers, New York, and the references cited therein.

In general, since my work has shown that electron sensitivity comes from the unsaturated ester groups, it is preferable to have as many anhydride groups present in the initial copolymer so that its esterification produces the maximum number of ester groups. I have found that the anhydride copolymer should contain a minimum of 25 mole percent anhydride groups with the maximum being the 50 mole percent which represents the maximum amount of maleic anhydride that can be incorporated in any copolymer.

These anhydride groups are extremely reactive with the above-named alcohols, readily forming the half-ester with the other moiety of the anhydride group forming a carboxyl group. The second carboxyl group can be esterified but requires much more vigorous reaction conditions and either an acidic or basic catalyst which must be removed at the end of esterification reaction if essentially all of the carboxyl groups are to be esterified. Furthermore, I have found that the presence of carboxyl groups is desirable, especially when the compositions are to be coated on a metal substrate, since the carboxyl group increases the adhesion of the film to the metal substrate which is highly desirable to prevent lifting or undercutting when an acid is used to etch away the metal not covered by the resist coating.

The reaction of these anhydride groups with the desired alcohol to form the half-ester occurs readily in the temperature range of from room temperature up to 100° C., without catalyst and without production and necessity for removal of water. Therefore, since the esterified polymer does not require purification or work-up procedures after esterification, I generally prefer not to carry the esterification beyond the point where there is an equal number of ester and carboxyl groups in the esterified copolymers, i.e., the formation of the half-ester. However, where desired, increased electron sensitivity can be gained by increasing the number of ester groups up to as much as two ester groups for each carboxyl group, in the copolymer and still retain sufficient carboxyl groups to provide adequate adhesion to a metal substrate.

Since any unesterified anhydride groups in the copolymer would be no more effective than the other monomer copolymerized wtih the maleic anhydride insofar as contributing to the electron sensitivity is concerned, I prefer that at least 50 mole percent and preferably from 80 to 100 mole percent of the anhydride groups be converted to at least the half-ester group. The optimum compositions, from the point of view of ease of preparation of a copolymer having a high electron-sensitivity and excellent adhesion to metal are those copolymers containing essentially (i.e., approximately or from a practical point of view) 50 mole percent maleic anhydride derived repeating units wherein essentially all of the anhydride groups have been esterified. The preparation of these copolymers and their conversion to half-esters are well known in the art and form no part of this invention.

In order that those skilled in the art may better understand my invention, the following examples are given by way of illustration and not by way of limitation. In all of the examples parts are by weights and temperatures are in degrees centigrade unless otherwise stated.

EXAMPLE 1

An essentially equimolar copolymer of maleic anhydride and octadecyl vinyl ether is commercially available as a 40% solution in toluene. The allyl half-ester of this polymer was prepared by refluxing a mixture of 100 g. of the solution of this polymer with 100 ml. of allyl alcohol overnight on a steam bath. The reaction mixture was added dropwise over five minutes to two liters of methanol which caused the half-ester to precipitate as an easily filterable solid. After filtering the semi-dry powder weighed 120 g. It was dried under vacuum at room temperature to constant weight to give a yield of 44 g. of the allyl half-ester. The I.R. spectrum of the product showed no evidence of the anhydride group initially present in the polymer.

EXAMPLE 2

In similar manner the crotyl half-ester of the anhydride copolymer of Example 1, was prepared using 25 g. of the copolymer solution in toluene and 25 ml. of crotyl alcohol (2-buten-1-ol). A yield of 13 gm. of the half-ester was obtained whose I.R. spectrum showed no evidence of the anhydride group.

EXAMPLE 3

In a similar manner as described in Example 1, the propargyl half-ester of the maleic anhydride copolymer with octadecyl vinyl ether was prepared by refluxing a mixture of 25 g. of the 40% toluene solution of the copolymer, 25 ml. of additional toluene and 25 ml. of propargyl alcohol, overnight. The half-ester was isolated by evaporation of the volatile materials under vacuum of a water aspirator with a liquid nitrogen trap in the vacuum line. The product was a waxy powder initially, but became a dry, white powder weighting 9 g. after two hours drying in a vacuum oven at 35°. The yield was low in this case because of initial unsuccessful attempts to isolate the polymer by precipitation techniques. Again, the I.R. spectrum showed no evidence of the anhydride group. It did show a strong absorbtion peak at 3.05 microns characteristic of the acetylenic group.

EXAMPLE 4

In a similar manner as described in Example 1 the half-ester of 2-hydroxyethylmethacrylate and maleic anhydride copolymer with octadecyl vinyl ether was prepared by reacting an excess of 2-hydroxyethylmethacrylate with the maleic anhydride-octadecyl vinyl ether copolymer solution overnight. The 2-methacryloyloxyethyl half-ester was precipitated by pouring the reaction mixture into an excess of methanol. It weighed 16 g.

EXAMPLE 5

In a similar manner as described in Example 1 the propyl half-ester of the maleic anhydride-octadecyl vinyl ether copolymer was prepared by refluxing a mixture of 25 g. of the copolymer solution and 25 ml. of n-propyl alcohol overnight. The propyl half-ester was precipitated by pouring the reaction mixture into two liters of methanol and drying to constant weight. A yield of 12 g. was obtained.

EXAMPLE 6

An essentially equimolar copolymer of maleic anhydride and iso-butyl vinyl ether is commercially available as a white powder. The allyl half-ester was prepared by refluxing a solution of 10 g. of this material with 80 g. of allyl alcohol on a steam bath for 18 hours. The half-ester solution in the excess alcohol was diluted with methanol to give about a 7% solution of the half-ester. This solution was used in Example 11.

EXAMPLE 7

The maleic anhydride copolymer with methyl vinyl ether in essentially equimolar amounts is commercially available as a white powder. The allyl-half-ester was prepared by refluxing a solution of 10 g. of this copolymer in 20 g. allyl alcohol for two hours on a steam bath. At the end of this time I.R. spectrum showed no evidence of anhydride group being present. The solution of the half-ester in excess allyl alcohol was diluted with methanol to give about a 15% solution which was used in Example 11.

EXAMPLE 8

The maleic anhydride copolymer with ethylene in essentially equimolar amounts is commercially available. The allyl half-ester was prepared by refluxing a solution of 10 g. of this copolymer in 20 g. of allyl alcohol for 2 hours on a steam bath. At the end of this time the I.R. spectrum showed no evidence of the anhydride group. The half-ester in excess allyl alcohol was diluted with methanol to give about a 15% solution which was used in Example 11.

EXAMPLE 9

The maleic anhydride copolymer with styrene in essentially equimolar amounts is available commercially. The allyl half-ester was readily prepared by refluxing overnight a solution of 10 g. of the copolymer in 20 g. of allyl alcohol and 20 g. of xylene. The I.R. spectrum showed that about 70% of the anhydride groups had been esterified to the half-ester. After evaporating the volatiles from the reaction mixture on a steam bath, the half-ester was dissolved with benzene to give about a 15% solution which was used in Example 11.

EXAMPLE 10

According to De Wilde et al., in J. Polymer Sci. 5, 253 (1949), to prepare a maleic anhydride copolymer with methyl acrylate which is essentially equimolar, the polymerizable mixture of monomers must contain a ratio of about 9 moles of maleic anhydride to 1 mole of methyl acrylate. After flushing a 2 liter 3-neck flask containing 1 liter of benzene for 1 hour with dry nitrogen, 176 g. of maleic anhydride and 17.4 g. of methyl acrylate and 0.5 g. of lauryl peroxide were added and heated at reflux for 3 hours, after which it was cooled and allowed to stand at room temperature overnight. From this reaction mixture, 1.5 g. of maleic anhydride copolymer with methyl acrylate was isolated by precipitation by addition of petroleum ether as described in the reference. The I.R. spectrum and the determination of the acid number indicated that essentially an equimolar copolymer had been prepared. It was converted to the allyl half-ester by refluxing a solution of the 1.5 g. prepared above in 20 ml. of allyl alcohol for five hours by which time essentially all of the anhydride groups had been converted to the half-ester as shown by the I.R. spectrum. The solution of the half-ester in excess allyl alcohol was diluted with acetone to give about an 8.5% solution.

EXAMPLE 11

The electron beam sensitivity of the compositions prepared above was determined by the following general procedure. Commercially available glass plates having a 3,000 A. thick chromium layer (optical density of 4) on one of the two major surfaces was used in all cases as a substrate. Solutions of the various half-esters were prepared with the concentration and the solvent being chosen so that on spin-coating the chromium layer with the solution, smooth pinhole-free coatings of the half-esters, approximately 0.2–0.5 micron were obtained. After evaporation of the solvent, the coated plates were exposed to an electron beam to give a dot pattern with each dot being exposed to a progressively higher radiation dose than the previous dot with the range being sufficiently broad to underexpose some dots while overexposing other dots. The exposed plates were then placed in a stirred solvent for the coating which caused the unexposed areas and the insufficiently exposed dots to dissolve leaving those dots which had been sufficiently cross-linked that they were no longer soluble in the solvent. By this means it was possible to determine the minimum radiation dose which produced a dot which would no longer dissolve in the solvent. The results on the above compositions are shown in the following table.

| Half-ester | Solvent | Concentration developer solvent [1] | Minimum dosage required, coul./cm.$^2$ |
|---|---|---|---|
| Example: | | | |
| 1 | Benzene | 10% 80/20 benzene methanol | $4\times10^{-8}$ |
| 2 | do | 5% benzene | $1\times10^{-6}$ |
| 3 | do | 10% 50/50 benzene butyl-acetate. | $3\times10^{-7}$ |
| 4 | n-Butylacetate | 10% n-butylacetate | $3\times10^{-8}$ |
| 5 | Benzene | 10% benzene | $>10^{-5}$ |
| 6 | As prepared | 50/50 methanol n-butyl-acetate. | $3\times10^{-8}$ |
| 7 | As prepared | 50/50 methanol n-butyl-acetate. | $1\times10^{-8}$ |
| 8 | As prepared | 50/50 methanol n-butyl-acetate. | $2\times10^{-7}$ |
| 9 | As prepared | Benzene | $2\times10^{-6}$ |
| 10 | do | Acetone | $3\times10^{-7}$ |

[1] Mixtures are on a volume basis.

The results in the above table show clearly that for the compositions to require a radiation dose no greater than $5\times10^{-7}$ coul./cm.$^2$, an unsaturated half-ester is definitely required and that the unsaturation must be terminal unsaturation i.e. $CH_2=C<$ or a terminal acetylenic group, i.e., $CH\equiv C-$. The results further show that an aryl group should not be present in the composition.

EXAMPLE 12

The composition of Example 1 was further tested as an etch-resist by using it to coat the chromium layer on glass slides as described above. These were exposed to radiation dose of $4\times10^{-8}$ coul./cm.$^2$ with an electron beam controlled to give a pattern of a series of lines 6 microns wide and separated by a distance of 6 microns. After dissolving away the unirradiated portion of the coating to expose the underlying chromium layer, the plates were heated for 10 minutes at 180° to evaporate any absorbed solvent and to cause cross-linking through any unsaturation still remaining in the copolymer. The exposed chromium was dissolved with an etching solution of 10% nitric acid and 10% ceric sulfate in water at 30°. The coating which was irradiated and not dissolved by the developing solution adequately protected the underlying chromium layer from being attached during the etching step and the line pattern showed greater than 0.2 micron edge resolution.

Although the above examples have shown various modifications and variations of my invention, it is obvious that other modifications and variations are possible and will be readily recognized by those skilled in the art. For example other metals can be used in place of the chromium, the metal does not need to be a coating on another substrate, but can be a self-supporting structure such as a printing plate, a semi-conductor, i.e., a silicon wafer, etc.

What I claim as new and desire to secure by Letters Patent of the United States is:

1. In the process of producing a desired pattern on a
It is therefore, to be understood that changes may be made in the particular embodiments of the invention described which are within the full intended scope of the invention as defined by the appended claims.
substrate by insolubilizing a surface coating of a polymerizable composition on selected areas of a substrate by irradiation of said areas with electrons to a radiation dose sufficient to convert said coating on said areas to a state where it is insoluble in a solvent in which it was soluble prior to irradiation and thereafter dissolving the coating from the unirradiated areas with said solvent, the improvement wherein the polymerizable composition comprises an ester of a copolymer of (a) maleic anhydride and (b) at least one monomer copolymerizable therewith selected from the group consisting of $C_{2-3}$-alkenes, vinyl $C_{1-20}$-alkyl ethers, $C_{1-8}$-alkyl esters of acrylic acid and $C_{1-8}$-alkyl esters of $\alpha$-($C_{1-8}$-alkyl)acrylic acids, wherein from 25–50 mole percent of the repeating units of said copolymer are maleate-derived moieties of (a) and bear both —COOR and —COOH groups in an average ratio for the copolymer of from 1 to 2 of the former to 1 of the latter where R is allyl, $\alpha$-($C_{1-8}$-alkyl) allyl, propargyl or $$CH_2=\overset{R'}{\overset{|}{C}}-\overset{O}{\overset{\|}{C}}-O-R''-$$

where R' is hydrogen or $C_{1-8}$ alkyl and R'' is $C_{2-8}$-alkylene, said ester having an electron sensitivity such that an irradiation dose no greater than $5\times10^{-7}$ coulombs/cm.$^2$ causes said insolubilization.

2. The improvement of claim 1 wherein the monomer of (b) is a vinyl alkyl ether.

3. The improvement of claim 2 wherein the vinyl alkyl ether is vinyl methyl ether.

4. The improvement of claim 1 wherein the R of the ester group is allyl.

5. The improvement of claim 1 wherein the R of the ester group is propargyl.

6. The improvement of claim 1 wherein the R of the ester group is 2-methacryloyloxyethyl.

7. The improvement of claim 1 wherein the polymerizable composition is an allyl ester of copolymer where (a) and (b) are present in essentially equimolar amounts.

8. The improvement of claim 1 wherein the polymerizable composition is an allyl ester of an essentially equimolar copolymer of maleic anhydride and a vinyl alkyl ether.

9. The improvement of claim 1 wherein the polymerizable composition is an allyl ester of an essentially equimolar copolymer of maleic anhydride and a $C_{2-3}$-alkene.

10. The improvement of claim 1 wherein the polymerizable composition is an allyl ester of an essentially equimolar copolymer of maleic anhydride and an acrylate ester.

References Cited

UNITED STATES PATENTS 3,594,243 7/1971 Deutsch et al. ........ 156—13

FOREIGN PATENTS 1,207,532 7/1966 Germany ............ 117—161
1,147,382 4/1963 Germany ............ 117—161
1,555,957 2/1968 France ............... 156—13

OTHER REFERENCES

Chem. Abstracts, vol. 64, 1966, p. 14419g, Heat Hardenable Surface Coatings & Varnishes from Polymeric Allyl Compounds.

Chem. Abstracts, vol. 59, 1963, p. 11731a, Laminates Molding Compounds & Bonded Sheets.

ALFRED I. LEAVITT, Primary Examiner

M. F. ESPOSITO, Assistant Examiner

U.S. Cl. X.R.

117—8, 62, 93.31, 161 UB; 204—159.15, 159.16

UNITED STATES PATENT OFFICE
CERTIFICATE OF CORRECTION

Patent No. 3,703,402 Dated November 21, 1972

Inventor(s) Herbert S. Cole, Jr.

It is certified that error appears in the above-identified patent and that said Letters Patent are hereby corrected as shown below:

Column 7, in the table, column 3 should be two columns and should read as follows:

| Concentration | Developer Solvent |
|---|---|
| 10% | 80/20 benzene methanol |
| 5% | benzene |
| 10% | 50/50 benzene butyl acetate |
| 10% | n-butyl acetate |
| 10% | benzene |
| | 50/50 methanol n-butyl acetate |
| | benzene |
| | acetone |

Column 7, lines 62 through 64, transpose these lines so that they follow line 68 and precede line 69.

Signed and sealed this 1st day of May 1973.

(SEAL)
Attest:

EDWARD M. FLETCHER, JR.
Attesting Officer

ROBERT GOTTSCHALK
Commissioner of Patents